United States Patent
Mansour et al.

(10) Patent No.: US 10,547,951 B2
(45) Date of Patent: Jan. 28, 2020

(54) MICROMECHANICAL SOUND TRANSDUCER SYSTEM AND CORRESPONDING MANUFACTURING METHOD

(71) Applicant: Robert Bosch GmbH, Stuttgart (DE)

(72) Inventors: Ahmad Mansour, Weil der Stadt (DE); Daniel Pantel, Ditzingen (DE); Fabian Purkl, Rutesheim (DE); Kerrin Doessel, Stuttgart (DE); Thomas Buck, Tamm (DE); Thomas Northemann, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 109 days.

(21) Appl. No.: 15/861,787

(22) Filed: Jan. 4, 2018

(65) Prior Publication Data

US 2018/0192204 A1    Jul. 5, 2018

(30) Foreign Application Priority Data

Jan. 5, 2017  (DE) .................. 10 2017 200 111

(51) Int. Cl.
| | |
|---|---|
| *H04R 17/02* | (2006.01) |
| *B81B 3/00* | (2006.01) |
| *H04R 17/00* | (2006.01) |
| *H04R 31/00* | (2006.01) |

(52) U.S. Cl.
CPC ......... *H04R 17/025* (2013.01); *B81B 3/0072* (2013.01); *H04R 17/005* (2013.01); *H04R 31/006* (2013.01); *B81B 2201/0257* (2013.01)

(58) Field of Classification Search
CPC .. H04R 17/025; H04R 17/005; H04R 31/006; B81B 3/0051; B81B 3/0072
See application file for complete search history.

(56) References Cited

U.S. PATENT DOCUMENTS

| | | | | |
|---|---|---|---|---|
| 3,976,899 | A | * | 8/1976 | Fanshawe ............ H03K 17/964 310/339 |
| 4,972,713 | A | * | 11/1990 | Iwata .................. B60R 25/1006 310/329 |
| 6,115,231 | A | * | 9/2000 | Shirakawa ......... H01H 59/0009 200/181 |
| 8,143,765 | B1 | * | 3/2012 | Yegingil ................ H02N 2/186 310/330 |
| 2002/0067663 | A1 | | 6/2002 | Loeppert et al. |
| 2002/0149071 | A1 | * | 10/2002 | Shim .................. H01H 59/0009 257/415 |

(Continued)

*Primary Examiner* — Helen C Kwok
(74) *Attorney, Agent, or Firm* — Norton Rose Fulbright US LLP; Gerard Messina

(57) ABSTRACT

A micromechanical sound transducer system includes a substrate that includes (a) a cavity with a cavity edge area, (b) a front side, and (c) a rear side; a piezoelectric vibrating beam that is elastically suspended on the front side and that extends across the cavity; and, for the piezoelectric vibrating beam, a respective deflection limiting device that is on a front edge area of the respective vibrating beam and that is configured to limit a deflection of the respective vibrating beam to a limiting deflection by causing the respective front edge area of the respective vibrating beam to interact with the cavity edge area or an opposing front edge area of another vibrating beam.

16 Claims, 3 Drawing Sheets

(56) References Cited

U.S. PATENT DOCUMENTS

| | | | |
|---|---|---|---|
| 2005/0224916 A1* | 10/2005 | Musalem | H01G 5/04 257/595 |
| 2005/0253486 A1* | 11/2005 | Schmidt | H01L 41/1136 310/329 |
| 2008/0135385 A1* | 6/2008 | Steeneken | H01H 59/0009 200/181 |
| 2008/0238257 A1* | 10/2008 | Kawakubo | H01G 5/18 310/328 |
| 2012/0267899 A1 | 10/2012 | Huffman et al. | |
| 2013/0088123 A1 | 4/2013 | Haskett | |
| 2014/0327339 A1* | 11/2014 | Katsumura | H01L 41/1134 310/321 |
| 2014/0339657 A1 | 11/2014 | Grosh et al. | |
| 2015/0188458 A1* | 7/2015 | Andosca | F03G 7/08 310/319 |
| 2015/0221855 A1* | 8/2015 | Vaeth | H01L 41/1136 310/319 |
| 2015/0349667 A1* | 12/2015 | Andosca | H02N 2/188 310/319 |
| 2016/0211778 A1* | 7/2016 | Okada | H01L 41/053 |
| 2017/0126149 A1* | 5/2017 | Hayamizu | H02N 2/186 |

\* cited by examiner a)

b)

c)

d)

a)

b)

c)

MICROMECHANICAL SOUND TRANSDUCER SYSTEM AND CORRESPONDING MANUFACTURING METHOD

CROSS-REFERENCE TO RELATED APPLICATIONS

The present application claims priority under 35 U.S.C. § 119 to DE 10 2017 200 111.9, filed in the Federal Republic of Germany on Jan. 5, 2017, the content of which is hereby incorporated by reference herein in its entirety.

FIELD OF THE INVENTION

The present invention relates to a micromechanical sound transducer system and to a corresponding manufacturing method.

BACKGROUND

Micromechanical microphone systems usually include a sound transducer device integrated on a MEMS chip for converting sound energy into electrical energy, a first electrode deflectable by sound energy, and a fixed, perforated second electrode (back plate) capacitively cooperating. The deflection of the first electrode is determined by the difference in the sound pressures in front of and behind the first electrode. When the deflection changes, the capacitance of the capacitor formed by the first and second electrodes is changed, which is metrologically detectable. Such a micromechanical microphone system is known from U.S. Pat. App. Pub. No. 2002/0067663.

Due to the fixed, perforated second electrode (back plate), the movement of the diaphragm is limited, and thus the dynamic range of the microphone system is limited, and moreover additional noise is generated by the air flow resistance.

From U.S. Pat. App. Pub. No. 2014/0339657 are known piezoelectric microphone systems, including vibrating beams, which enable a larger dynamic range and prevent additional noise, which increases the overall quality. The fundamental principle of the piezoelectric microphone systems is the use of a piezoelectric material, such as AlN, PZT, or another suitable piezoelectric material, which produces charges upon deformation and accordingly renders a voltage metrologically detectable.

At very high sound pressure levels or with extreme shocks, the vibrating beams of piezoelectric microphone systems bend greatly. In the worst case, this may result in irreparable damage to the vibrating beams.

A piezoelectric system is known from U.S. Pat. App. Pub. No. 2013/0088123, in which the vibrating beams are limited by an upper and a lower stop to an upper and a lower limiting deflection.

SUMMARY

While in principle applicable to arbitrary micromechanical sound transducer systems, such as speakers and microphones, the present invention and its underlying object are described based on silicon-based micromechanical microphone systems.

An aspect of the present invention is directed to a micromechanical sound transducer system. Another aspect of the present invention is directed to a method of manufacturing a micromechanical sound transducer system.

An idea underlying the present invention is formation of a deflection limiting device that causes either front edge areas of opposing vibrating beams or the front edge areas of respective vibrating beams to interact with the cavity area in order to limit a deflection of the respective vibrating beam to a limiting deflection.

In this way, it is possible in particular to implement pairs of opposing vibrating beams without stops, which lowers the production complexity. In particular, only a simple additional structure is used, which limits the deflection to an upper and a lower limiting deflection.

According to an example embodiment, one or multiple pairs of opposing vibrating beams are provided, the deflection limiting device being a respective elastic strip device, which mechanically connects respective opposing front edge areas and thereby causes the interaction. This enables a simple manufacture of the deflection limiting device of a sound transducer including a multitude of opposing vibrating beams.

According to an example embodiment, one or multiple vibrating beams are provided, the deflection limiting device being a respective elastic strip device, which mechanically connects the respective front edge area to the cavity edge area and thereby causes the interaction. This enables a simple manufacture of the deflection limiting device of a sound transducer including a multitude of individual vibrating beams.

According to an example embodiment, one or multiple pairs of opposing vibrating beams are provided, the deflection limiting device being a respective hook-like or comb-like integral molding on opposing front edge areas, which causes respective opposing front edge areas to stop in the limiting deflection and thereby causes the interaction. This results in an interaction only after the limiting deflection has been reached.

According to an example embodiment, the respective elastic strip device is designed as a non-linear spring device. When the deflection limiting device is designed as a non-linear spring device, its influence on the mechanical behavior and the performance of the sound transducer system is minimal during operation.

According to an example embodiment, the respective elastic strip device is formed of a polymer. The required elasticity of polymers is easy to set.

According to an example embodiment, the hook-like or comb-like integral moldings are situated in a plane of the vibrating beams in the non-deflected state of the vibrating beams. The deflection limiting device thus does not require additional space in the vertical direction.

The present invention will be described in greater detail hereafter based on the exemplary embodiments shown in the schematic figures of the drawings.

DETAILED DESCRIPTION

Figure 1:
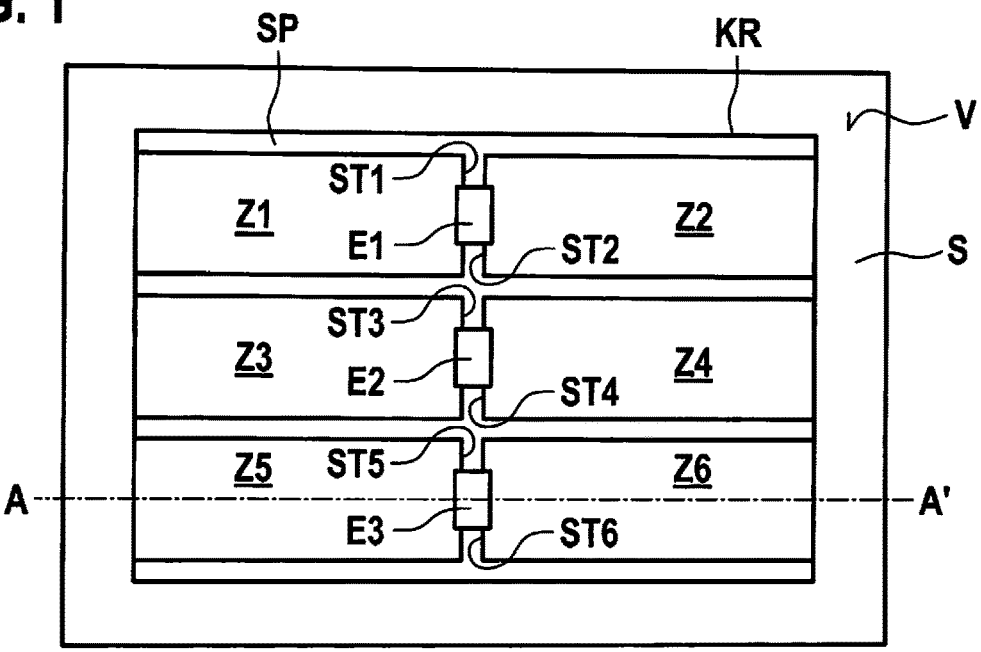
FIG. 1 shows schematic representations of a micromechanical sound transducer system, and in particular a top view in part (a) and a vertical cross section along line A-A' of part (a) in parts (b)-(d) in various deflection states, according to an example embodiment of the present invention.
Figure 1:
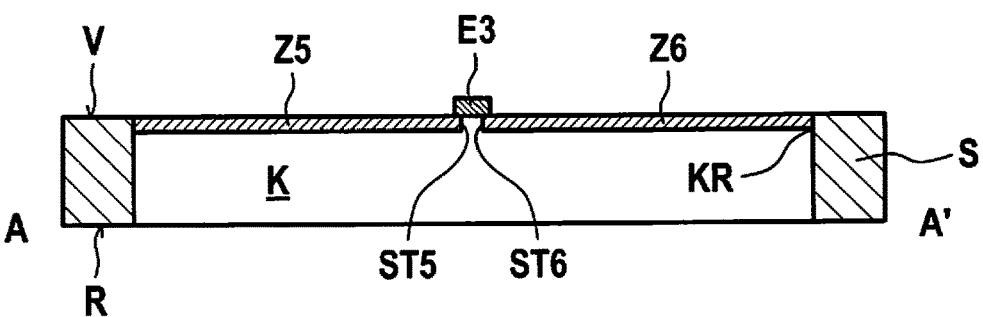
Figure 1:
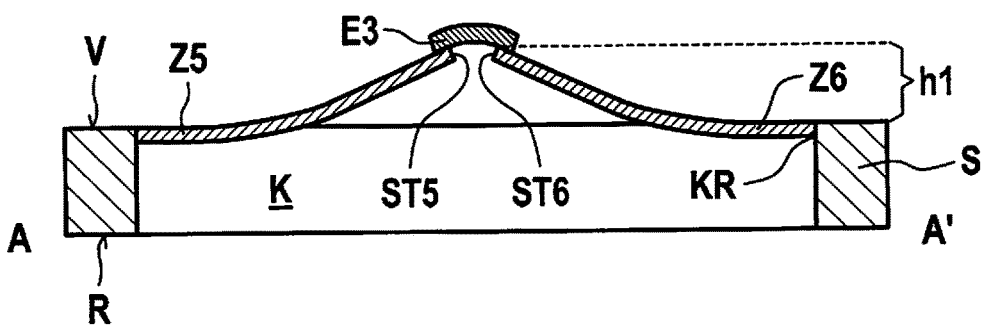
Figure 1:
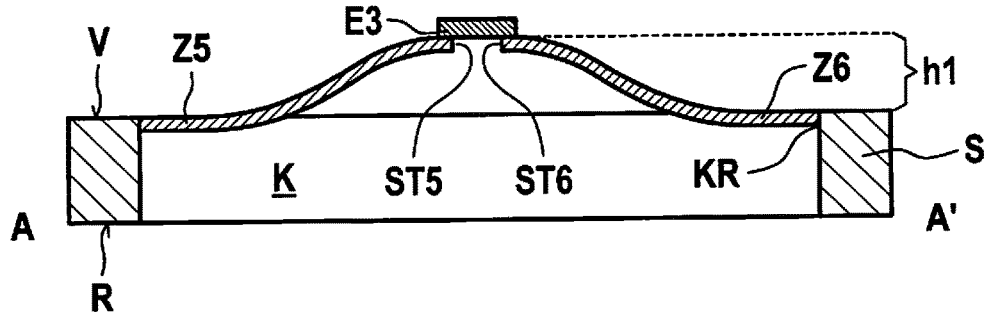

In the figures, identical reference numerals denote identical or functionally equivalent elements.

In FIG. 1, reference S denotes a substrate having a front side V and a rear side R and a cavity K having a cavity edge area KR.

A first through sixth piezoelectric vibrating beam Z1 through Z6, which extend across cavity K, are elastically suspended on front side V of substrate S. Vibrating beams Z1 through Z6 are situated in pairs opposite each other, the pairs being formed by vibrating beams Z1 and Z2, Z3 and Z4, and Z5 and Z6. A gap SP, which ensures the elastic deflectability of vibrating beams Z1 through Z6, is provided toward cavity edge KR and on respective front edge areas ST1 through ST6.

A deflection limiting device E1-E3 is provided between the front edge areas of opposing pairs ST1 and ST2, ST3 and ST4, ST5 and ST6, which is configured in such a way that it causes opposing front edge areas ST1 and ST2, ST3 and ST4, ST5 and ST6 to interact in order to limit a deflection of the pairs of vibrating beams Z1 and Z2, Z3 and Z4, Z5 and Z6 to an upper and a lower limiting deflection h1. Upper and lower limiting deflections h1 can, but need not, be symmetrical, and are to be activated in such a way that the desired acoustic spectrum of the sound transducer system is achievable.

In the first example embodiment, deflection limiting device E1-E3 is a respective elastic strip device, which is manufactured, for example, by a deposition and structuring process, and mechanically connects opposing front edge areas ST1 and ST2, ST3 and ST4, ST5 and ST6 and thereby causes the interaction.

Elastic strip devices E1-E3 are preferably implemented using polymers.

Part (b) of FIG. 1 shows the non-deflected position of vibrating beams Z5, Z6 of the sound transducer.

Part (c) of Figure shows the upper limiting deflection of vibrating beams Z5, Z6 of the sound transducer in a position where elastic strip device E1 through E3 not yet or hardly influences the deflection behavior. Elastic strip device E1 through E3 extends continuously and preferably does not generate an additional restoring force. Upper limiting deflection h1 defines the operating range of the sound transducer system, for example of a microphone system. As a result, the maximum sound pressure level to be detected should be within this operating range.

Part (d) of FIG. 1 shows a case in which an excessively high sound pressure or extreme shock is present. A further deflection of vibrating beams Z5, Z6 beyond upper limiting deflection h1 is avoided with the aid of elastic strip devices E1 through E3. At a certain tension of elastic strip devices E1 through E3, a restoring force occurs, which prevents further deflection. This is apparent in part (d) by inflection points in the curvature of vibrating beams Z5, Z6.

Figure 2:
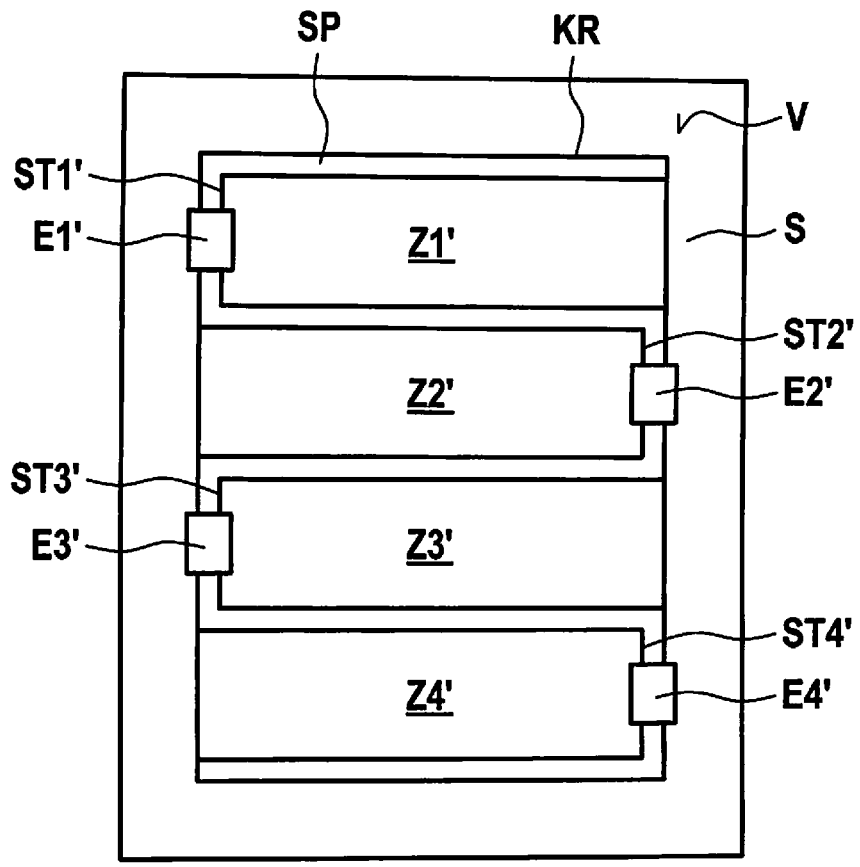
FIG. 2 shows a top view of a schematic representation of a micromechanical sound transducer system, according to an alternative example embodiment of the present invention.

FIG. 2 shows a schematic representation of a micromechanical sound transducer system according to a second example embodiment of the present invention in a top view.

In the second example embodiment according to FIG. 2, first through fourth vibrating beams Z1' through Z4' are suspended on front side V, which extend across cavity K and which have respective front edge areas ST1' through ST4'. Vibrating beams Z1' through Z4', in turn, are spaced apart from cavity edge KR and from adjoining vibrating beams by a gap SP to ensure the elastic deflectability.

In this second example embodiment, a respective elastic strip device E1' through E4' is provided between a respective front edge area ST1' through ST4' and cavity edge area KR to limit the deflection of respective vibrating beams Z1' through Z4' to a limiting deflection.

The deflection limiting device in the form of the elastic strip device in the second example embodiment is designed similarly to the first example embodiment.

The function is also similar to that which has already been described with respect to parts (b)-(d) of Figures.

Figure 3:
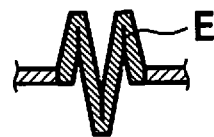
FIG. 3, parts (a)-(c) show schematic partial cross-sectional illustrations of a modification of the elastic strip device of the first and second example embodiments in various deflection states, according to an example embodiment of the present invention.
Figure 3:
Figure 3:
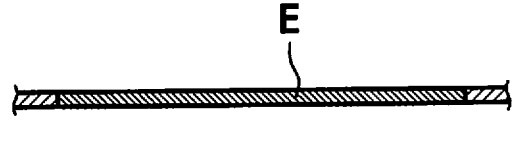

FIG. 3 shows schematic partial cross-sectional illustrations of a modification of the elastic strip device of the first and second example embodiments in various deflection states.

FIG. 3 shows a possible embodiment of deflection limiting device E, which can be used with the first and second example embodiments. Elastic strip device E is designed as a non-linear crimped spring device here. Part (a) of Figure shows the non-deflected state, part (b) of FIG. 3 shows the deflected state to the limiting deflection, and part (c) of FIG. 3 shows the case in which an undesirable shock or an excessive sound pressure level is present. In the latter case, a further deflection is prevented by the non-linear behavior, the configuration preferably being in such a way that the restoring force of the spring device occurs preferably suddenly.

Figure 4:
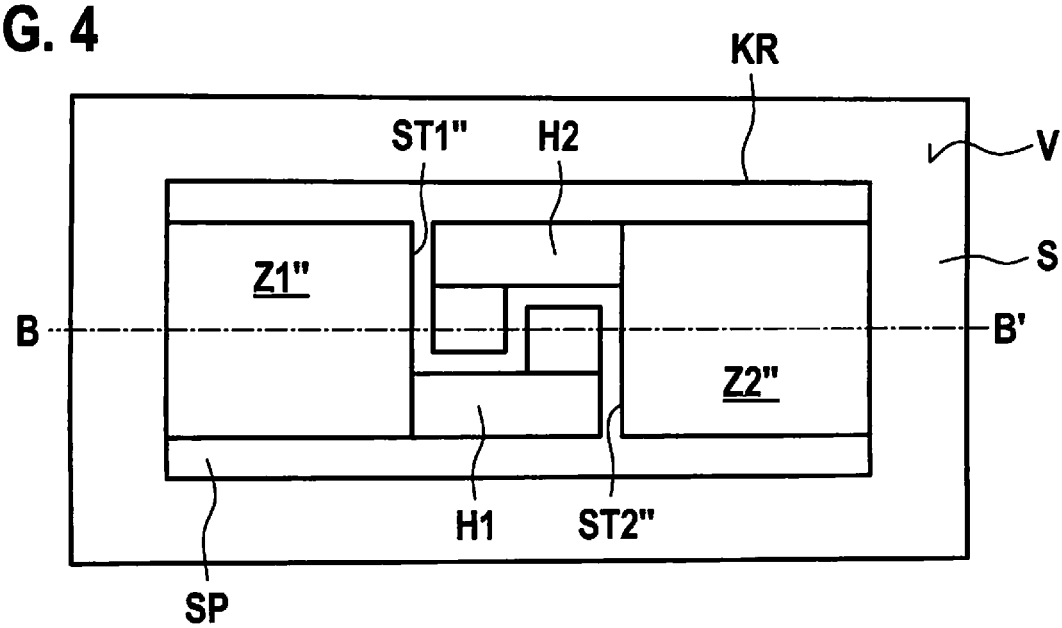
FIG. 4 show schematic representations of a micromechanical sound transducer system, and in particular a top view in part (a) and a vertical cross section along line B-B' of part (a) in parts (b)-(c) in various deflection states, according to an alternative example embodiment of the present invention.
Figure 4:
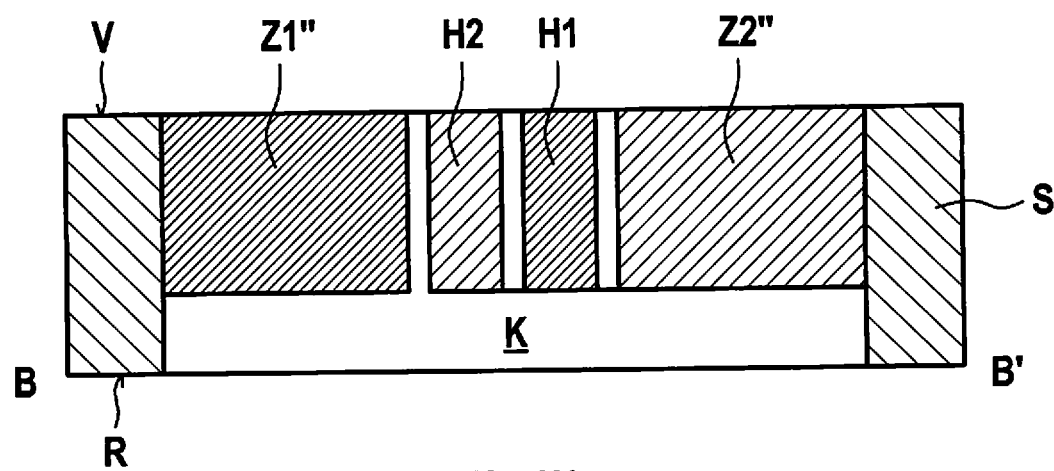
Figure 4:
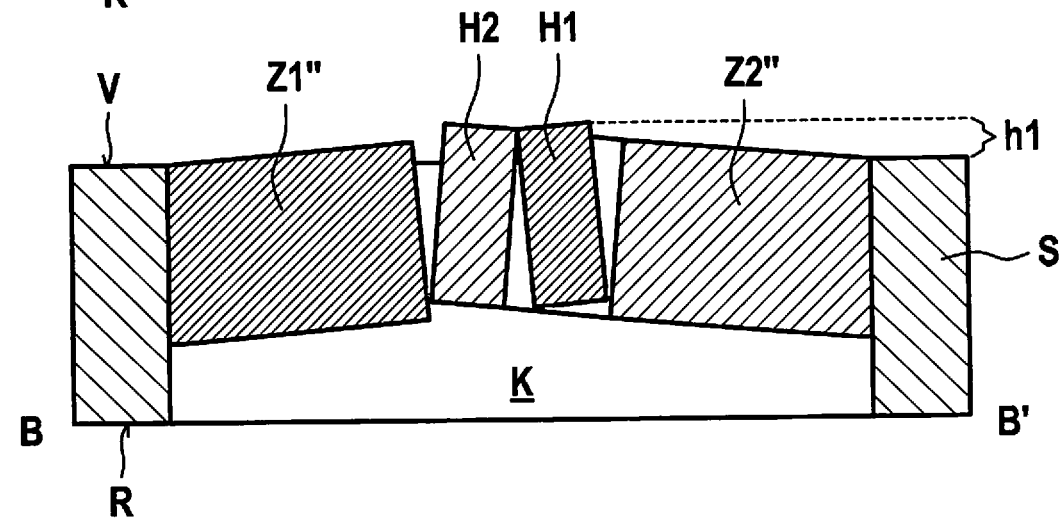

FIG. 4 shows schematic representations of a micromechanical sound transducer system according to a third example embodiment of the present invention, in which two vibrating beams Z1", Z2" are elastically suspended as a pair opposite each other on front side V, which extend across cavity K. In this third example embodiment, a respective hook-like integral molding H1, H2 is situated on opposing front edge areas ST", ST2" as deflection limiting device H1, H2, which causes opposing front edge areas ST1", ST2" to stop in the limiting deflection h1' and thereby causes the interaction.

In the non-deflected state of vibrating beams Z1", Z2", hook-like integral moldings H1, H2 are situated in a plane of vibrating beams Z1", Z2", as is apparent from part (b) of FIG. 4, and engage each other.

Opposing integral moldings H1, H2 only interlock in the upper or lower limiting deflection, as shown in part (c) of FIG. 4, and thus abruptly limit upper or lower limiting deflection h1'.

This third example embodiment has an advantage that hook-like integral moldings H1, H2 can be created in the same manufacturing process as vibrating beams Z1", Z2" and from the same materials, for example silicon or polycrystalline silicon or piezoelectric materials, such as AlN or PZT, or metals, which are typically used as electrodes (Mo, Pt, W). The third example embodiment is thus even simpler to manufacture compared to the above-described first and second example embodiments.

Additionally, there is no interaction whatsoever between two vibrating beams Z1", Z2" in the third example embodiment until upper or lower limiting deflection h1' is reached.

Although the present invention has been described above based on preferred exemplary embodiments, it is not limited thereto, but is modifiable in a variety of ways. In particular, the described geometries and materials are also only provided by way of example and can be varied depending on the application. Even though mutually engaging hook-like integral moldings are described as the deflection limiting device in an above-described example embodiment, it is also possible to use comb-like integral moldings.

What is claimed is:

1. A micromechanical sound transducer system, including:
   a substrate having a cavity with a cavity edge area, a front side, and a rear side;
   at least two front piezoelectric vibrating beams, each of which is elastically suspended on the front side and which extends across the cavity towards the rear side;
   at least two rear piezoelectric vibrating beams, each of which is elastically suspended on the rear side and which extends across the cavity towards a corresponding one of the front piezoelectric vibrating beams of the front side, so that there at least two pairs of front and rear piezoelectric vibrating beams; and
   a respective deflection limiting device, connecting each of the at least two pairs of front and rear piezoelectric vibrating beams, which is on a front edge area of a respective one of the vibrating beams and which is configured to limit a deflection of the respective vibrating beam to a limiting deflection by causing the respective front edge area of the respective vibrating beam to interact with an opposing front edge area of the corresponding one of the vibrating beams, which forms a corresponding one of the pairs.

2. The micromechanical sound transducer of claim 1, wherein the front and rear piezoelectric vibrating beams includes a plurality of piezoelectric vibrating beams, and the deflection limiting device connects to each other opposing front edge areas of a respective pair of the vibrating beams to thereby cause the interaction.

3. The micromechanical sound transducer system of claim 2, wherein the deflection limiting device is a hook-like or comb-like integral molding configured to cause the opposing front edge areas to stop at a maximum deflection and thereby cause the interaction.

4. The micromechanical sound transducer system of claim 1, wherein the deflection limiting device is a respective elastic strip device that mechanically connects to the cavity edge area of the respective front edge area of the respective vibrating beam on which the deflection limiting device is positioned to cause the interaction.

5. The micromechanical sound transducer system of claim 4, wherein the respective elastic strip device is a non-linear spring device.

6. The micromechanical sound transducer system of claim 4, wherein the respective elastic strip device is formed of at least one of a polymer, an AlN, and a metal.

7. The micromechanical sound transducer system of claim 3, wherein, in a non-deflected state of the front and rear piezoelectric vibrating beams, the deflection limiting device is situated in a plane of the vibrating beams.

8. The micromechanical sound transducer system of claim 2, wherein the deflection limiting device is a hook-like integral molding or a comb-like integral molding.

9. A method for manufacturing a micromechanical sound transducer system, the method comprising:
   providing a substrate having a cavity with a cavity edge area, a front side, and a rear side;
   forming at least two front piezoelectric vibrating beams, each of which is elastically suspended on the front side and which extends across the cavity towards the rear side;
   forming at least two rear piezoelectric vibrating beams, each of which is elastically suspended on the rear side and which extends across the cavity towards a corresponding one of the front piezoelectric vibrating beams of the front side, so that there at least two pairs of front and rear piezoelectric vibrating beams; and
   forming a respective deflection limiting device, connecting each of the at least two pairs of front and rear piezoelectric vibrating beams, which is on a front edge area of a respective one of the vibrating beams and which is configured to limit a deflection of the respective vibrating beam to a limiting deflection by causing the respective front edge area of the respective vibrating beam to interact with an opposing front edge area of the corresponding one of the vibrating beams, which forms a corresponding one of the pairs.

10. The method of claim 9, wherein the front and rear piezoelectric vibrating beams includes a plurality of piezoelectric vibrating beams, and the deflection limiting device connects to each other opposing front edge areas of a respective pair of the vibrating beams to thereby cause the interaction.

11. The method of claim 10, wherein the deflection limiting device is a hook-like or comb-like integral molding configured to cause the opposing front edge areas to stop at a maximum deflection and thereby cause the interaction.

12. The method of claim 9, wherein the deflection limiting device is a respective elastic strip device that mechanically connects to the cavity edge area of the respective front edge area of the respective vibrating beam on which the deflection limiting device is positioned to cause the interaction.

13. The method of claim 12, wherein the respective elastic strip device is a non-linear spring device.

14. The method of claim 12, wherein the respective elastic strip device is formed of at least one of a polymer, an AlN, and a metal.

15. The method of claim 11, wherein, in a non-deflected state of the front and rear piezoelectric vibrating beams, the deflection limiting device is situated in a plane of the vibrating beams.

16. The method of claim 10, wherein the deflection limiting device is a hook-like integral molding or a comb-like integral molding.

* * * * *